United States Patent
Zhang et al.

(10) Patent No.: US 11,862,547 B2
(45) Date of Patent: Jan. 2, 2024

(54) DIFFERENTIAL CROSSTALK SELF-CANCELATION IN STACKABLE STRUCTURES

(71) Applicant: Intel Corporation, Santa Clara, CA (US)

(72) Inventors: Zhichao Zhang, Chandler, AZ (US); Zhe Chen, Chandler, AZ (US); Srikant Nekkanty, Chandler, AZ (US); Sriram Srinivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 16/804,516

(22) Filed: Feb. 28, 2020

(65) Prior Publication Data
US 2021/0272892 A1  Sep. 2, 2021

(51) Int. Cl.
*H01L 23/498* (2006.01)
*H01L 23/538* (2006.01)
*H01L 23/58* (2006.01)

(52) U.S. Cl.
CPC .. *H01L 23/49838* (2013.01); *H01L 23/49811* (2013.01); *H01L 23/49827* (2013.01); *H01L 23/49833* (2013.01); *H01L 23/58* (2013.01)

(58) Field of Classification Search
CPC ........... H01L 23/5386; H01L 23/49811; H01L 23/49827
See application file for complete search history.

(56) References Cited

U.S. PATENT DOCUMENTS

| | | | |
|---|---|---|---|
| 9,722,012 B1* | 8/2017 | Pathmanathan | H10B 12/00 |
| 2007/0155195 A1* | 7/2007 | He | H01R 13/6461 |
| | | | 439/66 |
| 2009/0236706 A1* | 9/2009 | Chen | H01L 23/49503 |
| | | | 257/E23.031 |
| 2014/0268614 A1* | 9/2014 | Zhang | H01L 21/768 |
| | | | 174/262 |
| 2015/0085458 A1* | 3/2015 | Enriquez Shibayama | |
| | | | H05K 1/0228 |
| | | | 29/832 |
| 2015/0294945 A1* | 10/2015 | Fazelpour | H01L 21/4885 |
| | | | 257/665 |

* cited by examiner

*Primary Examiner* — Michele Fan
(74) *Attorney, Agent, or Firm* — Schwabe, Williamson & Wyatt, P.C.

(57) ABSTRACT

Embodiments include assemblies. An assembly includes a substrate having a first interconnect and a second interconnect. The first interconnect has a first conductive pad and a second conductive pad, and the second interconnect has a third conductive pad and a fourth conductive pad. The assembly includes a socket over the substrate. The socket has a first pin, a second pin, and a base layer with a first pad and a second pad. The first and second pins are vertically over the respective first and second interconnects. The first pad is directly coupled to the first pin and fourth conductive pad, while the second pad is directly coupled to the second pin and second conductive pad. The first pad is positioned partially within a footprint of the third conductive pad, and the second pad is positioned partially within a footprint of the first conductive pad.

25 Claims, 7 Drawing Sheets

DIFFERENTIAL CROSSTALK SELF-CANCELATION IN STACKABLE STRUCTURES

FIELD

Embodiments relate to packaging semiconductor devices. More particularly, the embodiments relate to semiconductor devices with stackable structures having swapped vertical conductive pins and interconnects used for differential crosstalk self-cancelation.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

Microelectronic packages generally have a socket to couple a central processing unit (CPU) package substrate to a motherboard. The socket has various pins used to communicate data between the CPU package substrate and the motherboard. Sockets are also one the major contributors to the data transfer rates associated with peripheral component interconnect express (PCIe) channels. The data rate for these PCIe channels is constantly increasing and has typically doubled for each transitioning generation, such as the transition from the $5^{th}$ generation to the $6^{th}$ generation. Coding schemes are used with PCIe channels to target pulse-amplitude modulation 4 (PAM4) levels, which relaxes the loss scaling, but poses more stringent requirements on crosstalk.

Accordingly, some approaches for mitigating the differential socket crosstalk in the existing technologies include reducing the socket height or electrical length, increasing socket ground pin count for additional isolation, and/or defining the pinmap to leverage the cancelation effects of the differential signals. For example, such approaches may reduce the electrical length or z-height of the socket pins, increase the overall number of ground pins to improve isolation and achieve a lower signal to ground ratio, and leverage the orthogonality of the differential pair orientation.

Socket height reduction, however, further compresses the mechanical solution space to achieve the proper working range for reliable physical connections. The miniature trend also increases the challenges and cost for manufacturing processes. Also, ground pin growth increases the overall pin count for the socket and connector and thus creates larger form factor and additional costs.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
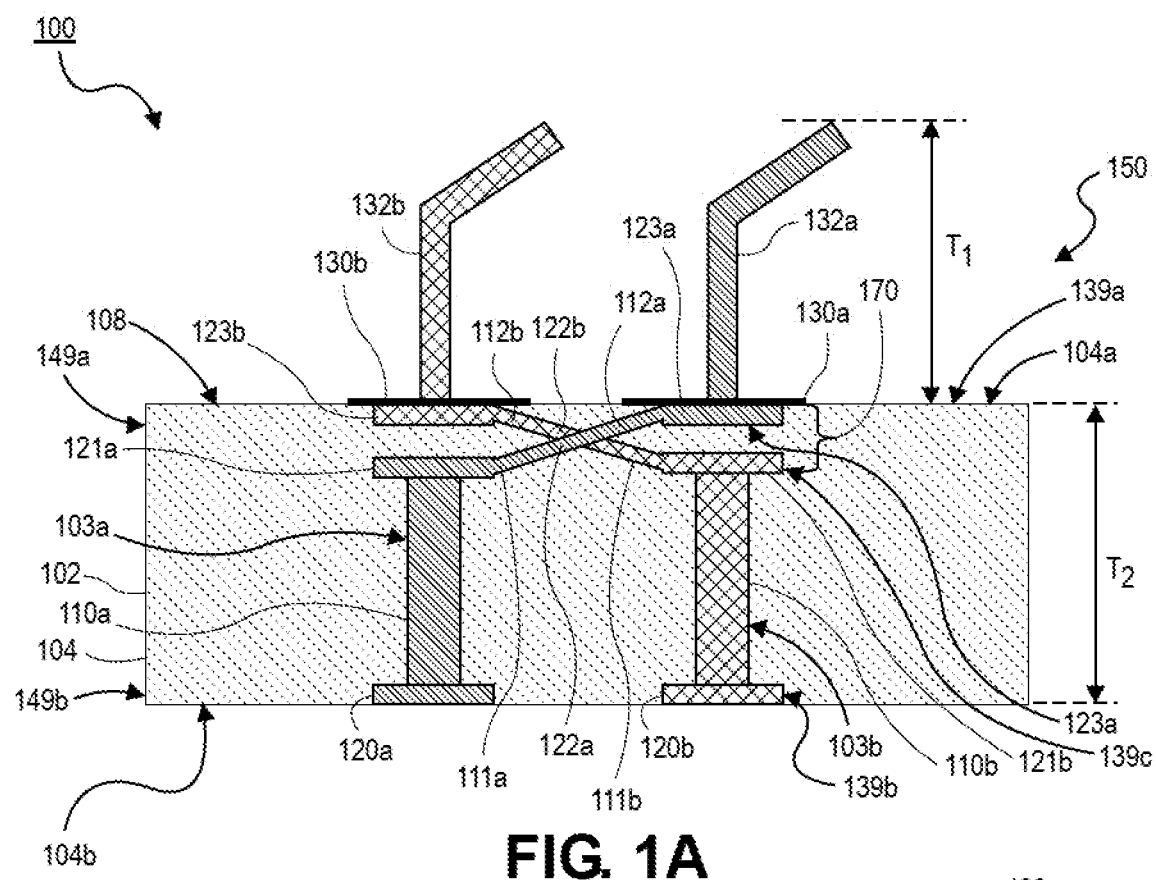
FIG. 1A is an illustration of a cross-sectional view of an assembly having a socket stacked on a substrate, where the socket has a plurality of pins stacked on a plurality of interconnects of the substrate, according to one embodiment.

Described herein are semiconductor devices with stacked structures having swapped vertical conductive pins and interconnects that may be used for differential crosstalk self-cancelation. The embodiments of the stacked structures described below may be implemented in one or more assemblies comprising of integrated circuit (IC) dies, sockets, substrates (e.g., a high-density interconnect (HDI) substrate, a low-density interconnect (LDI) substrates, interposers, etc.), and package substrates (e.g., a printed circuit board (PCB), a motherboard, an electronic package substrate such as a central processing unit (CPU) package substrate, etc.).

According to these embodiments, the assemblies may be comprised of a substrate having a first interconnect and a second interconnect, and a socket having a first pin, a second pin, and a base layer, where the socket may be disposed over the substrate. In one embodiment, the first interconnect of the substrate has a first conductive pad and a second conductive pad, and the second interconnect of the substrate has a third conductive pad and a fourth conductive pad. In some embodiments, the first interconnect may also have a first via, a second via, a first conductive line, and a second conductive line, while the second interconnect has a third via, a fourth via, a third conductive line, and a fourth conductive line (e.g., as shown below with the components of the first and second interconnects 103a-b of FIGS. 1A-1B).

For one embodiment, the base layer of the socket includes a first pad and a second pad. As shown in the embodiments below, the socket may have the first pin disposed directly on the first pad of the base layer, and the second pin disposed directly on the second pad of the base layer. In one embodiment, the first pad of the base layer of the socket may be disposed (or positioned) at least partially within a footprint of the third conductive pad of the second interconnect of the substrate; and the second pad of the base layer of the socket may be disposed at least partially within a footprint of the first conductive pad of the first interconnect of the substrate. In these embodiments, the first pin of the socket may be conductively coupled to the first interconnect of the substrate, and the second pin of the socket may be conductively coupled to the second interconnect of the substrate. Accordingly, as shown below in FIGS. 1A-1B, 2, and 3A-3B, the first and second pins of the socket may be respectively stacked (or coupled) on the first and second interconnects of the substrate to implement the stacked structure of the assembly, where the stacked structure may be implemented (or designed/patterned) with a polarity swapped configuration.

As described above, existing approaches to mitigate differential crosstalk in socket assemblies has led to increased technical challenges and costs that are associated with socket height reduction, complex pin maps, form-factor reduction, and increased number of total pins. Accordingly, in the embodiments described herein, the stacked structures have been implemented to achieve crosstalk self-cancelation (and/or substantially reduced crosstalk) (e.g., crosstalk may be substantially reduced by at least an average of 20 dB below a typical differential signal at a frequency of roughly 20 GHz), and overcome these existing technical challenges and costs. That is, in such embodiments, the stacked structure may be positioned in the assembly in a polarity swapped configuration to thereby effectively (i) reduce the crosstalk in the differential vertical pins and/or interconnects, and (ii) optimize the speed scaling in the peripheral component interconnect express (PCIe) channels, the high-speed serializer/deserializer (serdes) channels, and so on.

As described herein, a "polarity swapped configuration" may refer to a polarity swapping scheme (or a swapped routing structure) comprised of a first interconnect, a second interconnect, a first pin may have a first polarity (e.g., a positive polarity), and a second pin may have a second polarity (e.g., a negative polarity), where the first and second pins are concentrically swapped with the respective first and second interconnects to eliminate (or substantially reduce/mitigate) signal crosstalk such as differential crosstalk. For example, the polarity swapped configuration may be implemented as a swapped structure in the assembly, where the first and second interconnects are part of the swapped structure that may be positioned and patterned directly into the substrate. In particular, in one example, the swapped structure may be patterned directly between a top conductive layer and an intermediate conductive layer in the substrate (e.g., the intermediate conductive layer may be positioned proximately below the top conductive layer), where the swapped structure may be comprised of (i) the second via, the first and second conductive lines, and the second conductive pad of the first interconnect, and (ii) the fourth via, the third and fourth conductive lines, and the fourth conductive pad of the second interconnect. Accordingly, the stacked structures of the assembly with the swapped structures of the interconnects may therefore provide improvements to the existing packaging solutions by (i) enabling differential crosstalk self-cancelation within the vertical structure boundaries of the stacked pins and interconnects using the polarity swapped configuration, (ii) avoiding an increased number of total pins and a socket height reduction, and (iii) implementing low-cost substrate design rules.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including electronic devices with assemblies comprised of IC dies, sockets, HDI/LDI substrates, package substrates, swapped structures, and stacked structures, as described herein.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1A, a cross-sectional illustration of an assembly 100 is shown, in accordance with an embodiment. Additionally, in FIG. 1B, a plan illustration of the respective assembly 100 is shown, in accordance with an embodiment. For some embodiments, the assembly 100 may include a socket 150 disposed on and coupled to a substrate 102. In particular, the socket 150 may have a plurality of pins 132a-b that are respectively disposed on a plurality of interconnects 103a-b of the substrate 102.

As shown in FIG. 1A, the assembly 100 may have a first stacked structure and a second stacked structure with a swapped 170. For example, the stacked structures may include the first stacked structure comprised of pin 132a and interconnect 103a, and the second stacked structure comprised of pin 132b and interconnect 103b. In these embodiments, the first/second stacked structure may be implemented as an overall vertical transmission line that is divided into two (or more) swapped pins/interconnects—instead of a conventional single pin/interconnect structure. Additionally, in these embodiments, the first/second stacked structures may be implemented as a differential pair of vertical transmission lines having a pin/interconnect polarity that can be swapped in between the pins and interconnects through one or more conductive routing structures (e.g., metal vias, pads, lines, etc.).

Figure 1B:
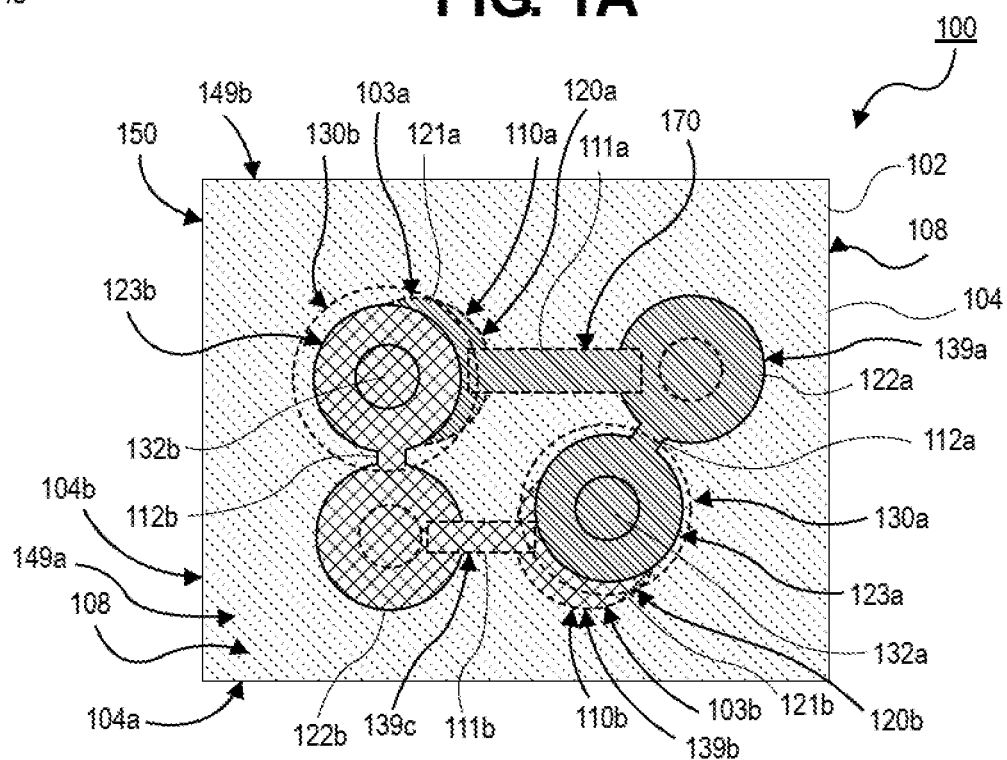
FIG. 1B is an illustration of a plan view of an assembly having a socket stacked on a substrate, where the socket has a plurality of pins stacked on a plurality of interconnects of the substrate, according to one embodiment.

For example, to implement the swapped polarity of the pins/interconnects, the pins 132a-b and interconnects 103a-b may be positioned to have a polarity swapped configuration in the respective socket 150 and substrate 102. Accordingly, as shown in FIGS. 1A-1B, the polarity swapped configuration may be implemented by having the pins 132a-b of the socket 102 stacked on the respective interconnects 103a-b of the substrate 102, and by swapping the pins 132a-b with the respective interconnects 103a-b at the swapped structure 170 (or a substantially concentric location between the pins 132a-b and the interconnects 103a-b).

In some embodiments, the socket 150 may be a CPU socket, a connecting device, or the like with one or more mechanical components that may provide mechanical and electrical connections between a CPU (or the like) and a PCB (or the like). For one embodiment, the socket 150 may be, but is not limited to, a pin grid array (PGA) socket, a land grid array (LGA) socket, and a ball grid array (BGA) socket. Additionally, in one embodiment, the socket 150 may include a housing body (or the like) having a top conductive layer (or surface) and a bottom conductive layer that is opposite from the top conductive layer. Accordingly, in these embodiments, the pins 132a-b of the socket 150 may be disposed in the housing body in the polarity swapped configuration to enable the crosstalk cancellation, improve the signal integrity, and increase the speed scaling in PCIe and high-speed serdes devices for the assembly 100.

In some embodiments, the socket 150 may have a thickness ($T_1$) of approximately 0.50 mm to 2 mm. In other embodiments, the socket 150 may have a thickness ($T_1$) of approximately 0.50 mm to 15 mm. In one embodiment, the thickness ($T_1$) of the socket 150 may be substantially similar or equal to the thickness ($T_2$) of the substrate 102. While, in another embodiment, the thickness ($T_1$) of the socket 150 may be greater or less than the thickness ($T_2$) of the substrate 102. Additionally, as shown in FIGS. 1A-1B, the socket 150 may have the pin 132a (or a first pin), the pin 132b (or a second pin), and a base layer 108. In some embodiments, the base layer 108 may be a bottommost conductive layer (or the bottom conductive layer) of the socket 150. The base layer 108 may be comprised of a plurality of pads 130a-b (e.g., a first pad 130a and a second pad 130b) and a plurality of respective pad openings (e.g., as shown with the pad openings 305 of FIGS. 3A-3B), where the pad openings may surround (or house) the respective pads 130a-b.

Note that, in these embodiments, the socket 150 may have a plurality of signal, ground, and/or miscellaneous pins, but for illustrative simplicity, only the first and second pins 132a-b of the stacked structures of the assembly 100 are shown. In some embodiments, the first and second pins 132a-b may be an interconnect, a transmission line, and/or the like. Additionally, in one embodiment, the first and second pins 132a-b may be implemented as a portion of the overall differential pair of transmission lines (e.g., the upper portions of the differential pair of transmission lines of the stacked structures). In one embodiment, the first pin 132a may be a negative polarity pin, and the second pin 132b may be a positive polarity pin (or vice-versa), where the first and second pins 132a-b may extend in the housing body of the socket 150 from or near the top conductive layer to the base layer 108. The base layer 108 with the first and second pads 130a-b may be positioned over/above the substrate 102.

Accordingly, as shown in FIGS. 1A-1B, the first pin 132a may be directly disposed on the first pad 130a, and the second pin 132b may be directly disposed on the second pad 130b. In particular, the first pad 130a (and/or the first pin 132a) of the socket 150 may be positioned at least partially within a footprint of a third conductive pad 120b of the second interconnect 103b of the substrate 102, while the second pad 130b (and/or the second pin 132b) of the socket 150 may be positioned at least partially within a footprint of the first conductive pad 120a of the first interconnect 103a of the substrate 102, according to some embodiments.

In some embodiments, the substrate 102 may be, but is not limited to, an HDI substrate, a LDI substrate, a multi-layer interposer (e.g., a hybrid interposer comprised of silicon and/or glass (or the like)), and/or a package substrate. For example, the substrate 102 may have a multi-layer, high-density (or low-density) circuitry with fine line/space (l/s) (or an ultra-fine l/s) patterns that increase the functionality of the substrate 102 using less area, where the multi-layer circuitry may include a plurality of conductive layers with metal (e.g., copper) filled microvias that create vertical interconnect structures. The substrate 102 may be a silicon substrate having increased (or high) input/output (I/O) density and bandwidth for the communication with the socket 150 and any other microelectronic devices of the assembly 100. In one embodiment, the substrate 102 may have a thickness ($T_2$) of approximately 10 um or greater. In another embodiment, the substrate 102 may have a thickness ($T_2$) of approximately 0.50 mm to 2.5 mm. In other embodiments, the substrate 102 may have a thickness ($T_2$) of approximately 0.50 mm to 15 mm. Also, as described above, the thickness ($T_2$) of the substrate 102 may be substantially similar or equal to the thickness ($T_1$) of the socket 150, according to some embodiments.

For one embodiment, the substrate 102 may include a plurality of redistribution layers (RDLs) comprised of dielectric layers and conductive layers (e.g., metals such as copper (or the like), alloys, etc.). The conductive layers of the substrate 102 may be comprised of conductive pads 123a-b, 121a-b, and 120a-b, conductive lines 111a-b and 112a-b (or conductive traces/planes), and/or conductive vias 110a-b (e.g., through silicon vias (TSVs), through glass vias (TGVs), or the like). Additionally, as described above, the first and second interconnects 103a-b may be implemented as a portion of the overall differential pair of transmission lines (e.g., the lower portions of the differential pair of transmission lines of the stacked structures). In one embodiment, the first interconnect 103a may be a negative polarity interconnect, and the second interconnect 103b may be a positive polarity interconnect (or vice-versa).

In some embodiments, the first interconnect 103a may have the first conductive pad 120a and a second conductive pad 123a, and the second interconnect 103b may have the third conductive pad 120b and a fourth conductive pad 123b. Accordingly, the first interconnect 103a may be coupled to the first pin 132a of the socket 150 by directly coupling the second conductive pad 123a of the first interconnect 103a to the first pad 130a of the socket 150. Likewise, the second interconnect 103b may be coupled to the second pin 132b of the socket 150 by directly coupling the fourth conductive pad 123b of the second interconnect 103b to the second pad 130b of the socket 150.

As shown in FIGS. 1A-1B, the substrate 102 may be conductively coupled to the socket 150 with the swap structure 170 of the first and second interconnects 103a-b. In one embodiment, the substrate 102 may have a body 104 comprised of one or more dielectric layers 149a-b and conductive routing layers 139a-c, where the body 104 has a top surface 104a and a bottom surface 104b that is opposite from the top surface 104a. In some embodiment, the top surface 104a has a first conductive layer 139a and a first dielectric layer 149a, and the bottom surface 104b has a second conductive layer 139b and a second dielectric layer 149b.

In one embodiment, the first conductive layer 139a may be comprised of, but is not limited to, the second and fourth conductive pads 123a-b, the second and fourth conductive lines 112a-b, and/or the top ends of the second and fourth vias 122a-b. Likewise, in one embodiment, the second conductive layer 139b may be comprised of, but is not limited to, the first and third conductive pads 120a-b and/or the bottom ends of the first and third vias 110a-b. In one embodiment, the first and second dielectric layers 149a-b may be a photosensitive dielectric layer, a solder resist layer, a solder mask, or the like.

Accordingly, as described above, the first and second interconnects 103a-b may be positioned with the swapped structure 170 in the body 104 of the substrate 102. Furthermore, as shown in FIGS. 1A-1B, the second conductive pad 123a of the first interconnects 103a may be positioned at least partially within the respective footprint of the third conductive pad 120b of the second interconnect 103b, while the fourth conductive pad 123b of the second interconnect 103b may be positioned at least partially within the respective footprint of the first conductive pad 120a of the first interconnect 103a.

In addition, according to some embodiments, a third conductive layer 339c may be disposed between the first and second conductive layers 139a-b in the body 104 of the substrate 102. The third conductive layer 139c may be positioned directly below (or proximately below) the first conductive layer 139a, where the third conductive layer 139c may be comprised of, but is not limited to, the first and third conductive lines 111a-b, the intermediate conductive pads 121a-b (and/or the top ends of the first and third vias 110a-b), and the bottom ends (or pads) of the second and fourth vias 122a-b. As such, the polarity swapped configuration of the first and second interconnects 103a-b may be implemented with the swapped structure 170 that is directly positioned and patterned between the first conductive layer 139a and the third conductive layer 139c, where the swapped structure 170 may be implemented with the second and fourth vias 122a-b, the first and third conductive lines 111a-b, the second and fourth conductive lines 112a-b, and/or the second and fourth conductive pads 123a-b of the respective first and second interconnects 103a-b.

Accordingly, to implement the polarity swamp in FIGS. 1A-1B, a short dogbone routing scheme (or the like) may be implemented on the first conductive layer 139a (or a top surface layer) of the substrate 102 to offset the second and fourth conductive pads 123a-b (i.e., the respective negative and positive polarities of the top conductive pads). The second and fourth conductive pads 123a-b may be respectively coupled to the second via 122a and the fourth via 122b with the second conductive line 112a and the fourth conductive line 112b. The second and fourth vias 122a-b may be routed from the first conductive layer 139a subsequently downward to the third conductive layer 139c (or an intermediate layer) at an offset routing location of the swapped structure 170.

Additionally, the second and fourth vias 122a-b may be respectively coupled to the first and third vias 110a-b with the first and third conductive lines 111a-b, where the first and third vias 110a-b may be positioned at an original routing location of the swapped structure 170 that may be used for the polarity swapping scheme (i.e., by routing the positive link under/below the original positive pad, and the negative link under/below the original negative pad). Lastly, the first and third vias 111a-b may be respectively coupled down to the first and third conductive pads 120a-b in the second conductive layer 139b (or a bottom surface layer) (e.g., the respective negative and positive polarities of the bottom conductive pads).

In an embodiment, the first and third vias 111a-b may have a thickness that is greater than a thickness of the second and fourth vias 112a-b. Also, in one embodiment, the first conductive line 111a may have a length (or a width) that is different or substantially equal to a length of the third conductive line 111b. Likewise, in one embodiment, the second conductive line 112a may have a length that is different or substantially equal to a length of the fourth conductive line 112b.

Lastly, for some embodiments, the first pad 130a of the socket 150 may have a footprint that may be directly positioned over a footprint of the third via 110b and/or a footprint of the third conductive pad 120b of the second interconnect 103b of the substrate 102. Likewise, for some embodiments, the second pad 130b of the socket 150 may have a footprint that may be directly positioned over a footprint of the first via 110a and/or a footprint of the first conductive pad 120a of the first interconnect 103a of the substrate 102. In alternative embodiments, the first pad 130a of the socket 150 may have a footprint that may be positioned at least partially within a footprint of the third via 110b and/or a footprint of the third conductive pad 120b of the second interconnect 103b of the substrate 102, while the second pad 130b of the socket 150 may have a footprint that may be positioned at least partially within a footprint of the first via 110a and/or a footprint of the first conductive pad 120a of the first interconnect 103a of the substrate 102. That is, in these other embodiments, a portion of the footprint(s) of the first/second pads 130a-b of the socket 150 may overlap a portion of the footprint(s) of the first/third conductive pads 120a-b and/or a portion of the footprint(s) of the first/third vias 110a-b of the substrate 102.

Note that the assembly 100 of FIGS. 1A-1B may include fewer or additional packaging components based on the desired packaging design.

Figure 2:
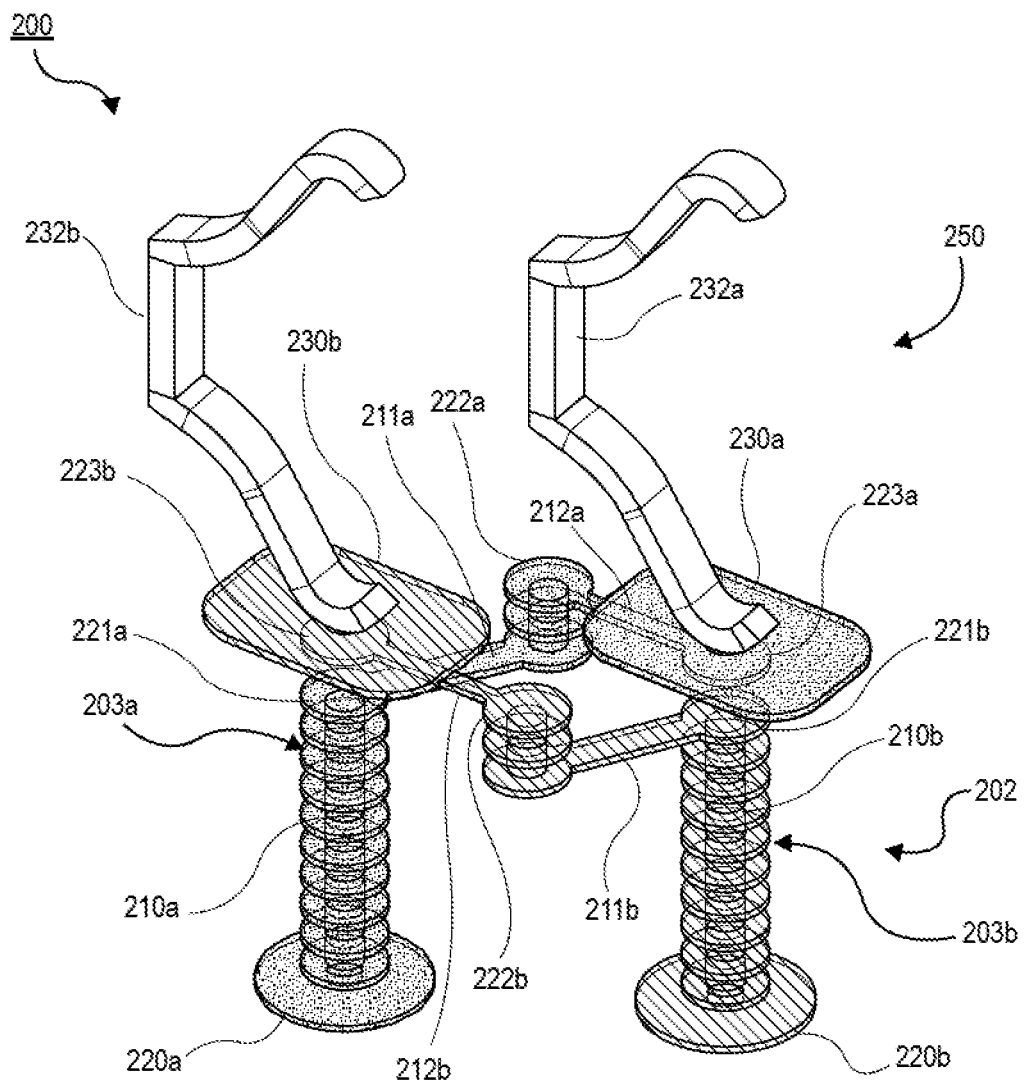
FIG. 2 is an illustration of a three-dimensional (3D) perspective view of an assembly having a stacked structure comprised of pins and interconnects, where the pins are respectively positioned on the interconnects in a polarity swapped configuration, according to one embodiment.

Referring now to FIG. 2, a three-dimensional (3D) perspective illustration of an assembly 200 is shown, in accordance with an embodiment. In particular, FIG. 2 is a detailed 3D perspective illustration of a polarity swap configuration (or a swap configuration) of a stacked structure in the assembly 200. For some embodiments, the assembly 200 may be substantially similar to the assembly 100 described above in FIGS. 1A-1B.

Likewise, the components of the assembly 200 may be substantially similar to the components of the assembly 100 described above in FIGS. 1A-1B. Accordingly, the socket 250, the substrate 202, the pins 232*a-b*, the interconnects 203*a-b*, the conductive lines 211*a-b* and 212*a-b*, the pads 230*a-b*, the conductive pads 223*a-b*, 221*a-b*, and 220*a-b*, and the vias 210*a-b* and 222*a-b* may be substantially similar to the socket 150, the substrate 102, the pins 132*a-b*, the interconnects 103*a-b*, the conductive lines 111*a-b* and 112*a-b*, the pads 130*a-b*, the conductive pads 123*a-b*, 121*a-b*, and 120*a-b*, and the vias 110*a-b* and 122*a-b* described above in FIGS. 1A-1B. Note that, in FIG. 2, only the pins 232*a-b* and the interconnects 203*a-b* are shown, while the housing bodies of the respective socket 250 and substrate 202 are omitted, for simplicity.

According to some embodiments, the assembly 200 may dispose the socket 250 over the substrate 202. The socket 250 may have a first pin 232*a*, a second pin 232*b*, and a base layer, where the base layer may further include a first pad 230*a* and a second pad 230*b*. In these embodiments, the first pin 232*a* may be directly disposed on the first pad 230*a*, and the second pin 232*b* may be directly disposed on the second pad 230*b*. Furthermore, the substrate 202 may have a first interconnect 203*a* and a second interconnect 203*b*. The first interconnect 203*a* may further include a first conductive pad 220*a* and a second conductive pad 223*a*, and the second interconnect 203*b* may further include a third conductive pad 220*b* and a fourth conductive pad 223*b*. Accordingly, in these embodiments, the first pad 230*a* of the socket 250 may be positioned at least partially within a footprint of the third conductive pad 220*b* of the second interconnect 203*b* of the substrate 202, while the second pad 230*b* of the socket 250 may be positioned at least partially within a footprint of the first conductive pad 220*a* of the first interconnect 203*a* of the substrate 202.

In these embodiments, the first pin 232*a* of the socket 250 may be communicatively coupled to the first interconnect 203*a* of the substrate 202, and the second pin 232*b* of the socket 250 may be communicatively coupled to the second interconnect 203*b* of the substrate 202. Furthermore, in some embodiments, the first interconnect 203*a* may have a first via 210*a*, a second via 222*a*, a first conductive line 211*a*, and a second conductive line 212*a*, while the second interconnect 203*b* may have a third via 210*b*, a fourth via 222*b*, a third conductive line 211*b*, and a fourth conductive line 212*b*.

The first via 210*a* may conductively couple the first conductive pad 220*a* (in/on a bottom conductive layer) to the first conductive line 211*a* at the conductive pad 221*a* (or the top end of the first via 210*a*). The second via 222*a* may conductively couple the first conductive line 211*a* (in an intermediate conductive layer) to the second conductive line 212*a* (in a top conductive layer). The second conductive line 212*a* may conductively couple the second via 222*a* to the second conductive pad 223*a*, where the second conductive pad 223*a* of the substrate 202 may be directly coupled to the first pad 230*a* of the socket 250. Respectively, the third via 210*b* may conductively couple the third conductive pad 220*b* (in the bottom conductive layer) to the third conductive line 211*b* at the conductive pad 221*b* (or the top end of the third via 210*b*). The fourth via 222*b* may conductively couple the third conductive line 211*b* (in the intermediate conductive layer) to the fourth conductive line 212*b* (in the top conductive layer). The fourth conductive line 212*b* may conductively couple the fourth via 222*b* to the fourth conductive pad 223*b*, where the fourth conductive pad 223*b* of the substrate 202 may be directly coupled to the second pad 230*b* of the socket 250.

Also note that, as shown in FIG. 2, the conductive routing components of the first interconnect 203*a* may have one or more size dimensions (e.g., widths, lengths, and/or thicknesses) that are substantially symmetrical to one or more size dimensions of the conductive routing components of the second interconnect 203*b*. That is, in some embodiments, the first via 210*a* may have a thickness that is substantially equal to a thickness of the third via 210*b*, while the second via 222*a* may have a thickness that is substantially equal to a thickness of the fourth via 222*b*. While, in an alternate embodiment, the first via 210*a* may have a thickness that is different from a thickness of the third via 210*b*, while the second via 222*a* may have a thickness that different from a thickness of the fourth via 222*b*.

Likewise, in some embodiments, the first conductive line 211*a* may have a length (or a width) that is substantially equal to a length of the third conductive line 211*b*, while the second conductive line 212*a* may have a length that is substantially equal to a length of the fourth conductive line 212*b*. While, in an alternate embodiment, the first conductive line 211*a* may have a length that is different from a length of the third conductive line 211*b*, while the second conductive line 212*a* may have a length that is different from a length of the fourth conductive line 212*b*.

Note that the assembly 200 may include fewer or additional packaging components based on the desired packaging design.

Figure 3A:
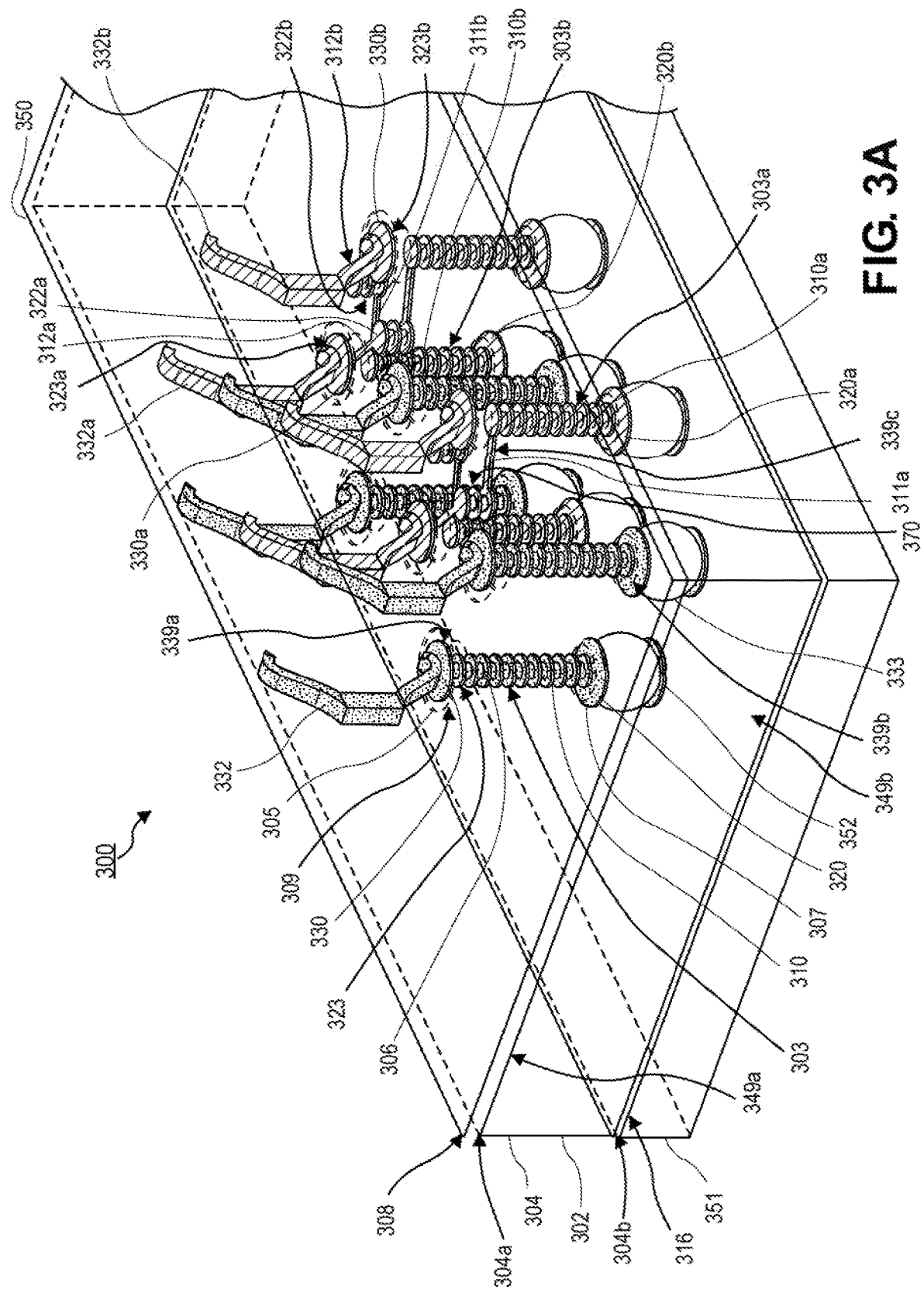
FIG. 3A is an illustration of a 3D perspective view of an assembly having a socket, a substrate, and a package substrate, where the socket has a plurality of pins stacked on a plurality of interconnects of the substrate, and where the socket and substrate are respectively stacked on the package substrate, according to one embodiment.
Figure 3B:
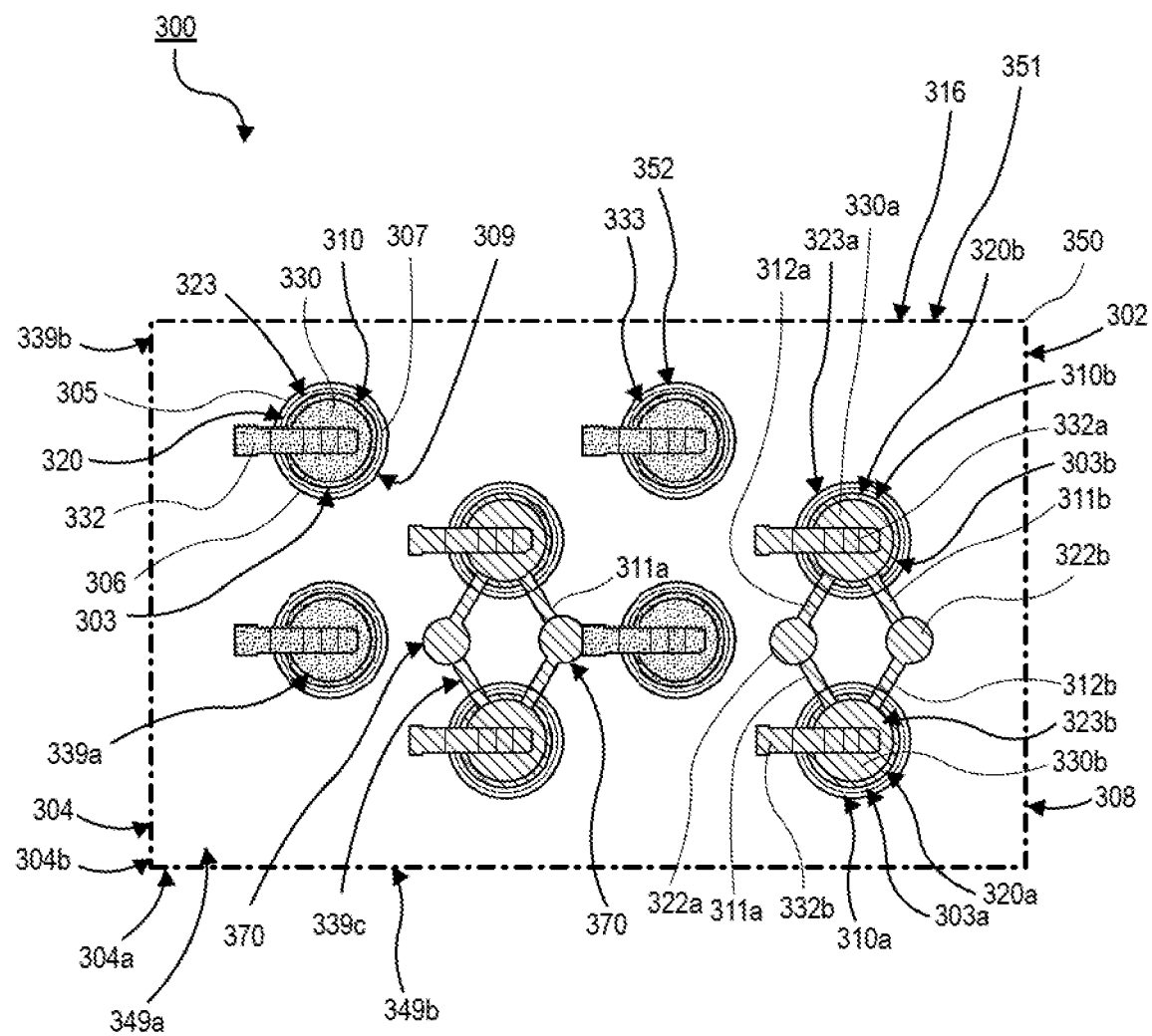
FIG. 3B is an illustration of a plan view of an assembly having a socket, a substrate, and a package substrate, where the socket has a plurality of pins stacked on a plurality of interconnects of the substrate, and where the socket and substrate are respectively stacked on the package substrate, according to one embodiment.

Referring now to FIGS. 3A-3B, a 3D perspective illustration and a respective plan illustration of an assembly 300 are shown, in accordance with some embodiments. For some embodiments, the assembly 300 may be substantially similar to the assembly 100 described above in FIGS. 1A-1B, with the exception that the interconnects 303 and 303*a-b* of the substrate 302 are coupled to the conductive pads 352 of the package substrate 351 with a plurality of solder balls 333, that only the interconnects 303*a-b* are in the polarity swapped configurations in the substrate 302, and that the remaining interconnects 303 of the substrate 302 are not swapped and thus extend vertically from the bottom conductive layer 304*a* to the top conductive layer 304*b*—without the conductive routing structures used for the polarity swapped configurations. That is, in these embodiments, the assembly 300 may implement the stacked structures of pins 323*a-b* and interconnects 303*a-b* in the polarity swapped configurations for only a desired number of differential pairs of stacked structures (e.g., for the most dominant aggressor-victim differential pairs to thereby ensure the largest benefit for the most dominant crosstalk aggressor pairs).

In addition, the components of the assembly 300 may be substantially similar to the components of the assembly 100 described above in FIGS. 1A-1B. Accordingly, the socket 350, the substrate 302, the pins 332*a-b*, the interconnects 303*a-b*, the conductive lines 311*a-b* and 312*a-b*, the pads 330*a-b*, the conductive pads 323*a-b*, 321*a*-b, and 320*a-b*, and the vias 310*a-b* and 322*a-b* may be substantially similar to the socket 150, the substrate 102, the pins 132*a-b*, the interconnects 103*a-b*, the conductive lines 111*a-b* and 112*a-b*, the pads 130*a-b*, the conductive pads 123*a-b*, 121*a-b*, and 120*a-b*, and the vias 110*a-b* and 122*a-b* described above in FIGS. 1A-1B. Also, as described above, the assembly 300 may further include the pins 332, the interconnects 303, the vias 310, and the conductive pads 320 and 323.

As shown in FIGS. 3A-3B, the assembly 300 may have the socket 350 disposed over the substrate 302, while the substrate 302 may be disposed over the package substrate 351. The substrate 302 may conductively couple the socket 350 to the package substrate 351. The substrate 302 may have a body 304 comprised of multiple dielectric layers 349*a-b* and conductive routing layers 339*a-c*, where the body 304 has a top surface 304*a* and a bottom surface 304*b* that is opposite from the top surface 304*a*.

In some embodiment, the top surface 304*a* has a first conductive layer 339*a* and a first dielectric layer 349*a*, and the bottom surface 304*b* has a second conductive layer 339*b* and a second dielectric layer 349*b*. In one embodiment, the first conductive layer 339*a* may be comprised of, but is not limited to, the conductive pads 323 (or the plurality of first conductive pads), the conductive pads 323*a-b* (or the second and fourth conductive pads), the conductive lines 312*a-b* (or the second and fourth conductive lines), and/or the top ends of the vias 322*a-b*. Likewise, in one embodiment, the second conductive layer 339*b* may be comprised of, but is not limited to, the conductive pads 320 (or the plurality of second conductive pads) and the conductive pads 320*a-b* (or the second and fourth conductive pads). In one embodiment, the first and second dielectric layers 349*a-b* may be a photosensitive dielectric layer, a solder resist layer, a solder mask, or the like.

The substrate 302 may have the interconnects 303 disposed in the body 304, where the interconnects 303 may vertically extend from the top surface 304*a* to the bottom surface 304*b* and conductively couple the conductive pads 323 to the conductive pads 320. In addition, the substrate 302 may have the interconnects 303*a-b* (or the first and second interconnects) disposed in the body 304, where one of the pairs of the interconnects 303*a-b* may be positioned adjacent to each other and positioned between the interconnects 303. Also, the pairs of interconnects 303*a-b* may be positioned in the body 304 in the polarity swapped configurations described herein. Furthermore, as shown in FIGS. 3A-3B, the conductive pads 323*a* of the first interconnects 303*a* may be positioned at least partially within the respective footprints of the conductive pads 320*b* of the second interconnects 303*b*, while the conductive pads 323*b* of the second interconnects 303*b* may be positioned at least partially within the respective footprints of the conductive pads 320*a* of the first interconnects 303*a*.

In addition, the substrate 302 may have a third conductive layer 339*c* disposed between the first and second conductive layers 339*a-b* in the body 304. The third conductive layer 339*c* may be positioned directly below (or proximately below) the first conductive layer 339*a*, where the third conductive layer 339*c* may be comprised of, but is not limited to, the conductive lines 311*a-b*, the top ends (or pads) of the vias 310*a-b*, and the bottom ends of the vias 322*a-b*. Additionally, as shown in these embodiments, the polarity swapped configurations of the interconnects 303*a-b* may be implemented as a swapped structure 370 (or a swapped routing structure) that is directly positioned and patterned between the first conductive layer 339*a* and the third conductive layer 339*c*. In these embodiments, the swapped structure 370 may be implemented with the via 322*a*, the conductive lines 311*a* and 312*a*, and the second conductive pads 323*a* of the first interconnects 303*a*, and with the via 322*b*, the conductive lines 311*b* and 312*b*, and the conductive pads 323*b* of the second interconnects 303*b*.

Furthermore, as shown in FIG. 3A, the vias 310*a* of the interconnects 303*a* vertically extend from the second conductive layer 339*b* to the third conductive layer 339*c*, where the vias 310*a* conductively couple the conductive pads 320*a* to the conductive lines 311*a* in the third conductive layer 339*c*. The vias 322*a* of the interconnects 303*a* vertically extend from the third conductive layer 339*c* to the first conductive layer 339*a*, where the vias 322*a* conductively couple the conductive lines 311*a* to the conductive lines 312*a* in the first conductive layer 339*a*. As such, the conductive lines 312*a* conductively couple the vias 322*a* to the conductive pads 323*a* of the interconnects 303*a* on the top surface 304*a* of the body 304 of the substrate 302.

Respectively, as shown in FIG. 3A, the vias 310*b* of the interconnects 303*b* vertically extend from the second conductive layer 339*b* to the third conductive layer 339*c*, where the vias 310*b* conductively couple the conductive pads 320*b* to the conductive lines 311*b* in the third conductive layer 339*c*. The vias 322*b* of the interconnects 303*b* vertically extend from the third conductive layer 339*c* to the first conductive layer 339*a*, where the vias 322*b* conductively couple the conductive lines 311*b* to the conductive lines 312*b* in the first conductive layer 339*a*. As such, the conductive lines 312*b* conductively couple the vias 322*b* to the conductive pads 323*b* of the interconnects 303*b* on the top surface 304*b* of the body 304 of the substrate 302.

In addition, the socket 350 may have the base layer 308 disposed over the top conductive layer 304*a* of the substrate 302, while the substrate 302 may have the bottom conductive layer 304*b* disposed over a top conductive layer 316 of the package substrate 351. According to these embodiments, the base layer 308 may have a plurality of openings 305 surrounding the respective pads 330 and 330*a-b* with gaps 309 in between; while the top and bottom conductive layers 304*a-b* may have a plurality of via openings 306-307 surrounding the respective pads 323 and 323*a-b* and/or the respective interconnects 303 and 303*a-b*. In one embodiment, the top and bottom ends of the interconnects 303 and 303*a-b* may extend through the respective via openings 306-307 of the substrate 302 to thereby couple the socket 350 to the package substrate 351. While, in another embodiment, the top and bottom ends of the interconnects 303 and 303*a-b* may be substantially coplanar to the respective top and bottom surfaces 304*a-b* of the substrate 302, where the respective conductive pads 323 and 323*a-b* and 320 and 320*a-b* may be coupled to the respective top and bottom ends of the interconnects 303 and 303*a-b*, and may be positioned over the respective openings 306-307 of the substrate 302. Note that, even if via openings 306-307 are shown in FIGS. 3A-3B, such via openings 306-307 may be shown for illustrative purposes as the respective pads 323 and 323*a-b* and vias 310 and 310*a-b* may occupy such openings.

In some embodiments, the bottom ends of the interconnects 303 and 303*a-b* may be coupled to the respective conductive pads 320 and 320*a-b* that are positioned directly below the via openings 307 of the bottom conductive layer 304*b* of the substrate 302. These conductive pads 320 and 320*a-b* of the substrate 302 may thus be coupled to the conductive pads 352 of the package substrate 351 with the solder balls 333. Likewise, in another example, the top ends of the interconnects 303 and 303*a-b* may be coupled to the respective conductive pads 323 and 323*a-b* that are positioned directly above the via openings 306 of the top conductive layer 340*a* of the substrate 302. These conductive pads 323 and 323*a-b* of the substrate 302 may thus be directly coupled to the respective pads 330 and 330*a-b* of the socket 350.

In addition, the pins 332, the interconnects 303, the vias 310, and the conductive pads 320 and 323 may be similar to the pins 332*a-b*, the interconnects 303*a-b*, the vias 310 *a-b*, and the conductive pads 320*a-b* and 323*a-b*. Also, as shown in FIG. 3A, the vias 310 may have a thickness that is substantially equal to a total thickness of one of the vias 310*a-b* and one of the vias 322*a-b* (i.e., the total thickness may be the combined sum of the thickness of the via 310*a* and the thickness of the via 322*a*). Furthermore, as shown in FIG. 3B, the pins 332*a-b* and interconnects 303*a-b* may be positioned in between and separated by the pins 332 and interconnects 303, where, for example, the vias 322*a-b* may be positioned vertically in line with (and/or adjacent to) some of the interconnects 303.

Note that the assembly 300 of FIGS. 3A-3B may include fewer or additional packaging components based on the desired packaging design.

Figure 4:
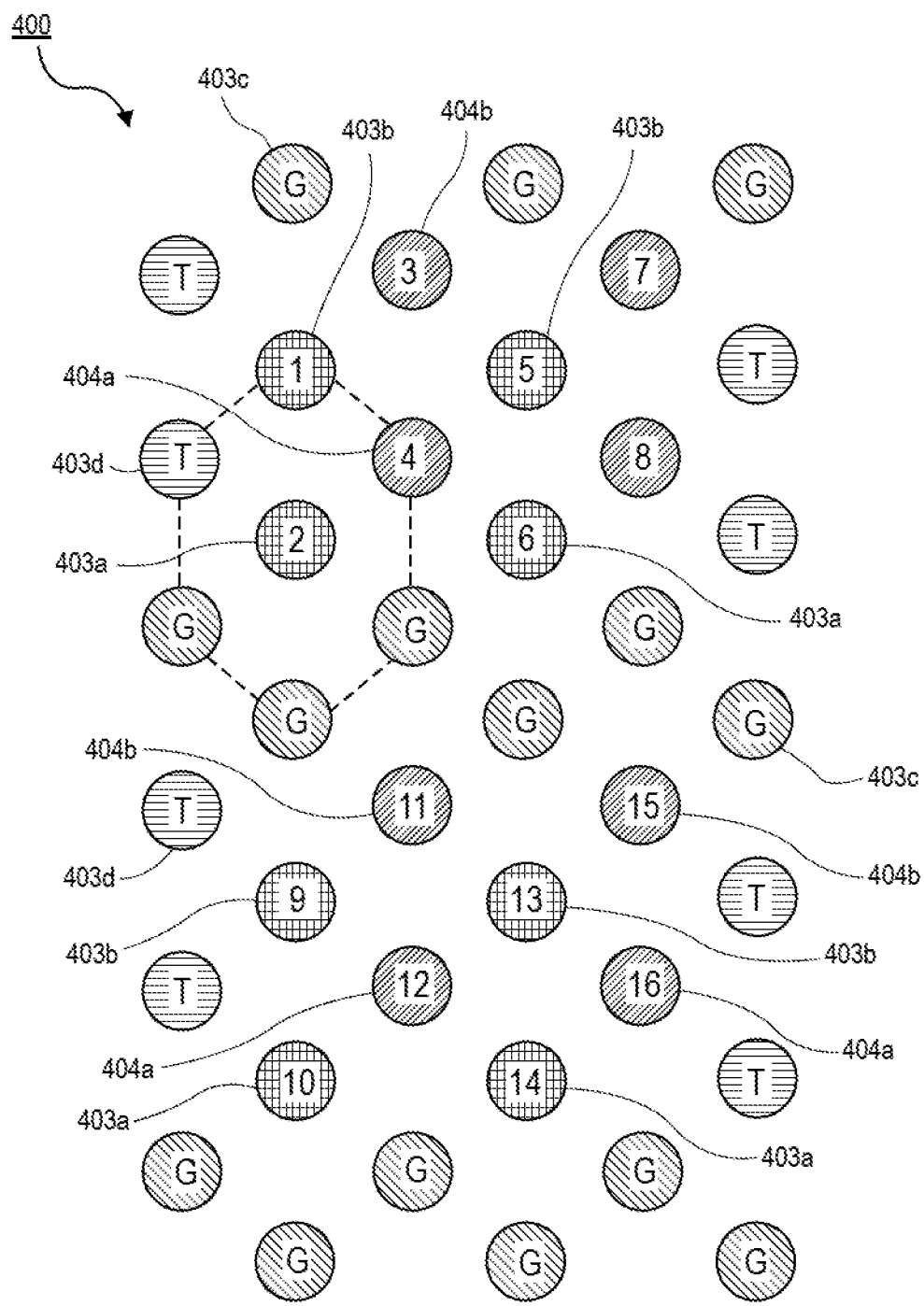
FIG. 4 is an illustration of a plan view of a pin map of an assembly having a plurality of signal pins, a plurality of ground pins, and a plurality of miscellaneous pins, where the signal pins are positioned in a polarity swapped configuration, according to one embodiment.

Referring now to FIG. 4, a plan illustration of a pin map of an assembly 400 is shown, in accordance with an embodiment. The pin map of the assembly 400 may include a plurality of interconnects 403*a-d* and 404*a-b* (or a plurality of pins). The assembly 400 may be substantially similar to the assembly 100 described above in FIGS. 1A-1B. Likewise, the components of the assembly 400 may be substantially similar to the assembly 400 described above in FIGS. 1A-1B.

As such, in some embodiments, the interconnects 403*a-d* and 404*a-b* of the pin map may be used to pattern (or position/map) the respective interconnects of a substrate (e.g., the substrate 102 of FIGS. 1A-1B) and/or the respective pins of a socket (e.g., the socket 150 of FIGS. 1A-1B), where the interconnects 403*a-d* and 404*a-b* may be substantially similar to the interconnects 103*a-b* and/or the pins 123*a-b* described above in FIGS. 1A-1B.

In some embodiments, the interconnects 403*a-b* and 404*a-b* may be a plurality of signal interconnects (i.e., the signal interconnect/pin groups shown with "(1,2)—(15,16)"), the interconnects 403*c* may be a plurality of ground interconnects (i.e., the ground interconnects shown with "G"), and the interconnects 403*d* may be a plurality of miscellaneous interconnects and/or interconnects (or pins) that may be implemented for any desired purpose (i.e., the miscellaneous interconnects shown with "T").

For some embodiments, the interconnects 403*a-b* and/or 404*a-b* may be distinctly positioned in a polarity swapped configuration in the assembly 400. Moreover, a first signal interconnect group of interconnects 403*a-b* and 404*a-b* (as shown with "(1,2)-(7,8)") may be separated from a second signal interconnect group of interconnects 403*a-b* and 404*a-b* (as shown with "(9,10)-(15,16)") by the interconnects 403*c*.

As shown in FIG. 4, within one signal interconnect group, the polarity swap configuration may be casted either on the interconnects 403*a-b* (as shown with "(1,2) and (5,6)") or the interconnects 404*a-b* (as shown with "(3,4) and (7,8)"), which may be the same case for the other signal interconnect groups, according to one embodiment. Also note, as described above, the polarity swap configuration may be casted on the most dominant aggressor-victim pairs, where, for example, only the interconnects 403*a-b* may have to be swapped as the other interconnects 404*a-b* may not have to be swapped, and where the interconnects 403*a-b* (or interconnects 404*a-b*) may thus be selected to implement the largest crosstalk cancellation benefit for the most dominant crosstalk aggressors in the assembly.

Note that the assembly 400 may include fewer or additional packaging components based on the desired packaging design.

Figure 5:
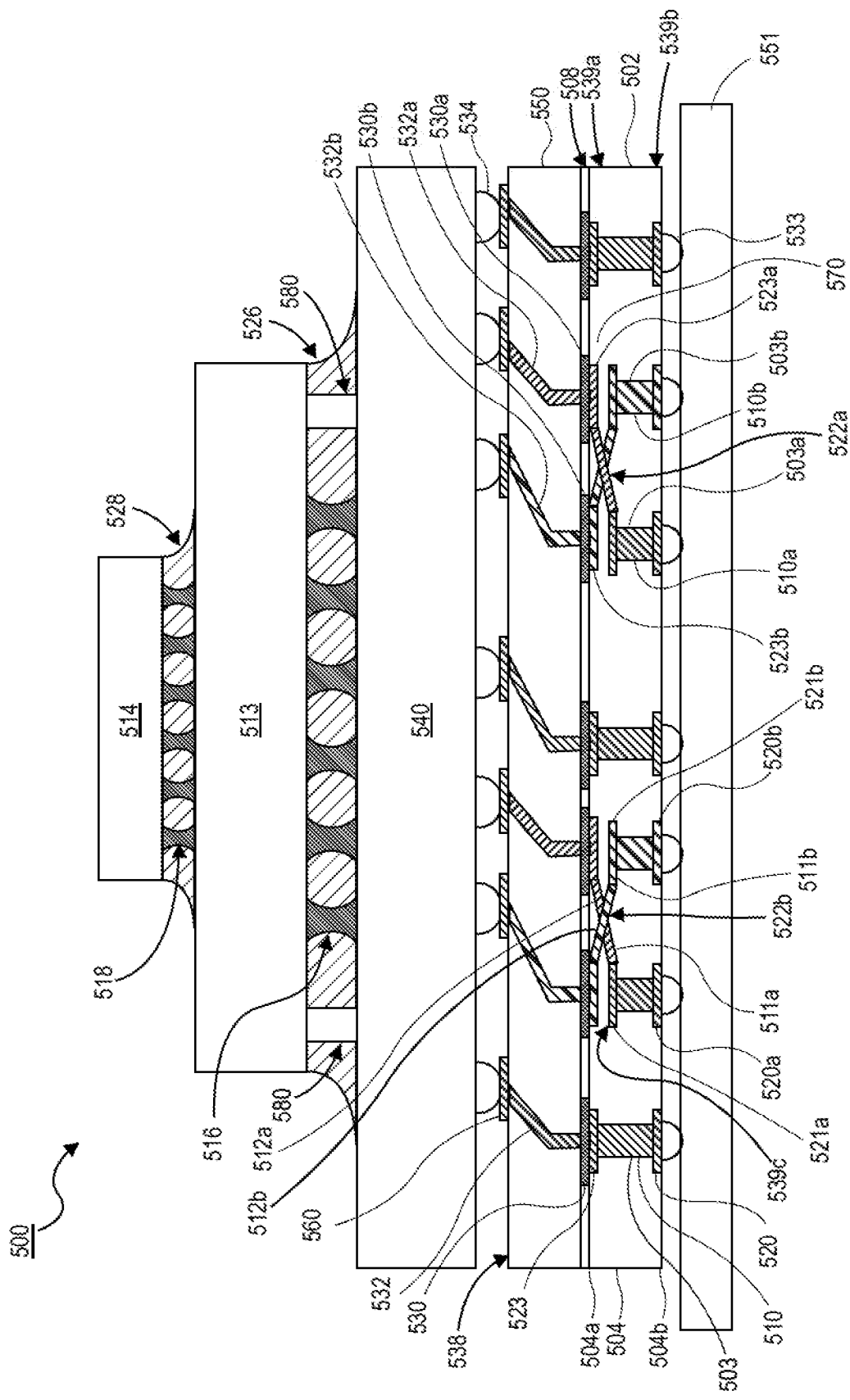
FIG. 5 is a cross-sectional view of an electronic packaged assembly having an integrated circuit die, a first package substrate, a socket, a substrate, and a second package substrate, according to one embodiment.

Referring now to FIG. 5, a cross-sectional illustration of a semiconductor packaged assembly 500 (or an electronic packaged assembly) is shown, in accordance with an embodiment. For some embodiments, the semiconductor packaged assembly 500 may include a die 514, a first substrate 513, a first package substrate 540, a socket 550, a second substrate 502, and a second package substrate 551, according to one embodiment.

As shown in FIG. 5, in one embodiment, the semiconductor packaged assembly 500 may include the die 514 disposed on the first substrate 513 (or an interposer), and the stack of die 514 and first substrate 513 respectively disposed on the first package substrate 540. In addition, for some embodiments, the semiconductor packaged assembly 500 may include the first package substrate 540 disposed on the socket 550, and the stack of first package substrate 540 and socket 550 respectively disposed on the second substrate 502. The socket 550 may couple the first package substrate 540 (e.g., a CPU package substrate) to the second substrate 502 (e.g., an HDI substrate, a LDI substrate, a multi-layer interposer with a low-profile, etc.) with a plurality of solder balls 534 and a plurality of pins 532 and 532*a-b*. For example, the socket 550 may have a top conductive layer 538 with a plurality of conductive pads 560, and a base layer 508 with a plurality of conductive pads 530 and 530*a-b*. As such, the first package substrate 540 may be coupled to the conductive pads 560 on the top conductive layer 538 of the socket 550; the pins 532 and 532*a-b* may be respectively coupled to the conductive pads 530 and 530*a-b* on the base layer 508 of the socket 550; and the respective pins 532 and 532*a-b* and conductive pads 530 and 530*a-b* may be coupled to a plurality of conductive pads 523 and 523*a-b* of a plurality of interconnects 503 and 503*a-b* of the second substrate 502.

Furthermore, in an embodiment, the semiconductor packaged assembly 500 may include the stack of socket 550 and second substrate 502 disposed on the second package substrate 551. The second substrate 502 may couple the socket 550 to the second package substrate 551 (e.g., a motherboard) with a plurality of solder balls 533 and the interconnects 503 and 503*a-b*. In these embodiments, the socket 550 and the second substrate 502 of the semiconductor packaged assembly 500 may be substantially similar to the socket 150 and the substrate 102 of the assembly 100 described above in FIGS. 1A-1B.

Likewise, the components of the socket 550 and the second substrate 502 may be substantially similar to the components of the sockets 150 and 350 and the substrates 102 and 302 described above in FIGS. 1A-1B and FIGS. 3A-3B. As such, the pins 532 and 532*a-b*, the pads 530 and 530*a-b*, the interconnects 503 and 503*a-b*, the conductive lines 511*a-b* and 512*a-b*, the conductive pads 520 and 520*a-b*, 521*a-b*, and 523*a-b*, the vias 510*a-b* and 522*a-b*, the surfaces 504*a-b* of the body 504, the conductive layers 539*a-c*, and the dielectric layer 549*a-b* may be substantially similar to the pins 332 and 332*a-b*, the pads 330 and 330*a-b*, the interconnects 303 and 303*a-b*, the conductive lines 311*a-b* and 312*a-b*, the conductive pads 320 and 320*a-b*, 321*a-b*, and 323*a-b*, the vias 310*a-b* and 322*a-b*, the surfaces 304*a-b* of the body 304, the conductive layers 339*a-c*, and the dielectric layer 349*a-b* described above in FIGS. 3A-3B. For example, as described herein, the pins 532*a-b* of the socket 550 may be disposed on the respective interconnects 503*a-b* of the second substrate 502, and the stacked structures of pins 532*a-b* and 503*a-b* may be positioned with the swapped structures 570 to implement the polarity swap configurations of the semiconductor packaged assembly 500. Note that, in one embodiment, the stacked structures of pins/interconnects in the polarity swap configuration, as described herein, may be implemented in the other microelectronic devices of the semiconductor packaged assembly 500 based on the desired packaging design (e.g., the die 514, the first substrate 513, and the first/second package substrates 540 and 551). Also note that the semiconductor packaged assembly 500 is not limited to the illustrated semiconductor packaged system, and thus may be designed/formed with fewer, alternate, or additional packaging components and/or with different interconnecting structures.

According to one embodiment, the semiconductor packaged assembly 500 is merely one example of an embodiment of a semiconductor packaged system. For one embodiment, the semiconductor packaged assembly 500 may include a BGA package, a LGA package, and/or a PGA package. For one embodiment, the die 514 is coupled to the first substrate 513 (e.g., an interposer) via one or more solder balls 518 (or bumps/joints) formed from respective microbumps, and the first substrate 513 is coupled to the first substrate 540 via one or more solder balls 516 formed from respective microbumps. As described above, a solder ball formed by soldering of a microbump according to an embodiment may itself be referred to as a "bump" and/or a "microbump." Additionally, one or more of the die 514, the first substrate 513, and the first/second package substrates 540 and 551 may be coupled using an anisotropic conductive film (ACF) or the like. For one embodiment, the first substrate 512 may be, but is not limited to, a silicon interposer and/or a die with through silicon vias (TSVs). For an alternate embodiment, the semiconductor packaged assembly 500 may omit the first interposer/substrate 513.

The first package substrate 540 and/or the second package substrate 551 may include a variety of electronic structures formed thereon or therein. In certain embodiments, the first and/or second package substrates 540 and 551 may be an organic substrate made up of one or more layers of polymer base materials or ceramic base materials, with conducting regions for transmitting signals. For some embodiments, the first/second package substrates 540 and 551 may include, but is not limited to, a package, a substrate, a PCB, a CPU package substrate, and a motherboard. In one embodiment, the first package substrate 540 is a CPU package substrate (or an electronic package substrate) and/or a PCB, while the second package substrate 551 is a motherboard. For one embodiment, the first/second package substrates 540 and 551 are made of an FR-4 glass epoxy base with thin copper foil laminated on both sides. For certain embodiments, a multilayer first/second package substrates 540 and 551 can be used, with pre-preg and copper foil used to make additional layers. For example, the multilayer first/second package substrates 540 and 551 may include one or more dielectric layers, where the dielectric layers may be a photosensitive dielectric layer. For one embodiment, the first/second package substrates 540 and 551 may also include one or more conductive layers, which may further include copper (or metallic) traces, lines, pads, vias, holes, and/or planes.

For one embodiment, the die 514 may be comprised, but are not limited to, a semiconductor die, an electronic device (e.g., a wireless device), an IC, a CPU, a graphic processing unit (GPU), a microprocessor, a platform controller hub (PCH), a memory (e.g., a high bandwidth memory (HBM)), and/or a field-programmable gate array (FPGA). Additionally, in other embodiments, the die 514, the first substrate 513, and/or the second substrate 502 may be comprised of one or more materials, including glass, crystal, diamond, low thermal conductive materials, high thermal conductive materials (e.g., gallium nitride (GaN) or the like), silicon, glass-based materials, and/or silicon-based materials (e.g., silicon carbide (SiC) or the like). Also, in other embodiments, the die 514 may be a plurality of chiplet dies. The die 514, the first substrate 513, and/or the second substrate 502 may be formed from a material such as silicon and have circuitry thereon that is to be coupled to the other devices, such as the socket 550 and the first/second package substrates 540 and 551.

Although some embodiments are not limited in this regard, the second substrate 502 may in turn be coupled to another body, for example, the second package substrate 551 such as a computer motherboard. One or more connections between one or more of the die 514, the first/second substrates 513 and 502, the socket 550, and the first/second package substrates 540 and 551—e.g., including some or all of bumps 516, 518, and 533-534—may include one or more interconnect structures and underfill layers 526 and 528. In some embodiments, these interconnect structures (or connections) may variously comprise an alloy of nickel, palladium, and tin (and, in some embodiments, copper).

Connections between one or more of the die 514, the first/second substrates 513 and 502, the socket 550, and the first/second package substrates 540 and 551 may be made using any suitable structure, such as the illustrative bumps 516, 518, and 533-534 shown. Although some embodiments are not limited in this regard, the semiconductor packaged assembly 500 may include gap control structures 580—e.g., positioned between the first substrate 513 and the first package substrate 540. Such gap control structures 580 may mitigate a change in the height of the gap between the first substrate and the first package substrate 513 and 540. Note that the semiconductor packaged assembly 500 includes the underfill material 528 between the first substrate 513 and the die 514, and the underflow material 526 between the first package substrate 540 and the first substrate 513. Also note that the underfill material may be disposed between the second substrate 502 and the second package substrate 551 if desired. For one embodiment, the underfill materials (or layers) 526 and 528 may be one or more polymers that are injected between the layers. For other embodiments, the underfill materials may be MUF.

Note that the semiconductor packaged assembly 500 may include fewer or additional packaging components based on the desired packaging design.

Figure 6:
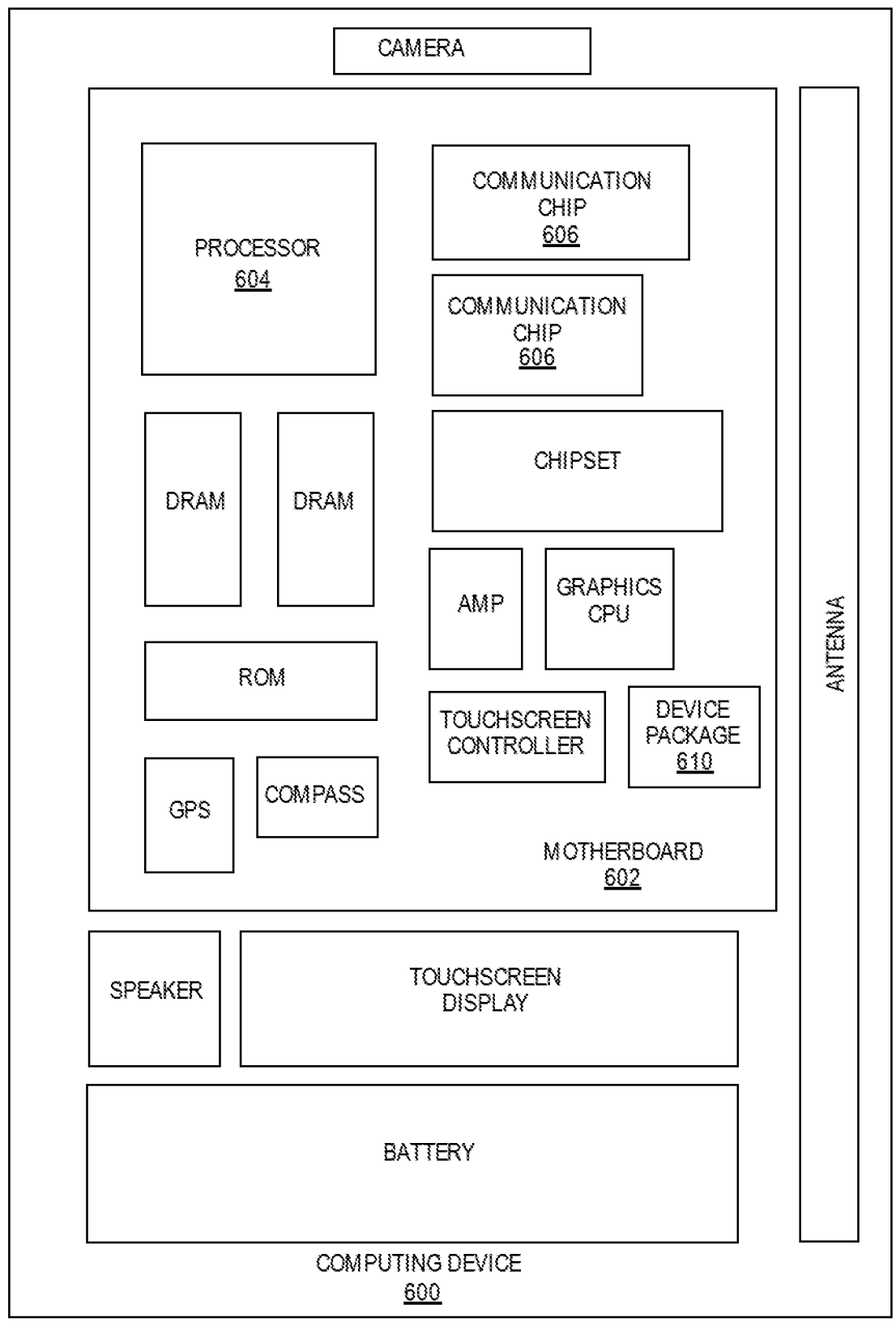
FIG. 6 is an illustration of a schematic block diagram of a computer system that utilizes an assembly having a socket stacked on a substrate, where the socket has a plurality of pins stacked on a plurality of interconnects of the substrate, according to one embodiment.

FIG. 6 is an illustration of a schematic block diagram illustrating a computer system 600 that utilizes a device package 610 (or a semiconductor packaged assembly) having a stacked structure comprised of pins and interconnects that are respectively positioned in a polarity swapped configuration, according to one embodiment. FIG. 6 illustrates an example of computing device 600. Computing device 600 houses a motherboard 602. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be a semiconductor packaged assembly that may include, but is not limited to, dies, package substrates, sockets, and/or substrates (e.g., an HDI substrate, a LDI substrate, and/or an interposer). In one embodiment, device package 610 may include an assembly that is substantially similar to the assembly 100 of FIGS. 1A-1B described herein. Device package 610 may include an assembly having a socket and a substrate, where one or more stacked structures comprised of pins and interconnects are respectively positioned in a polarity swapped configuration in the respective socket and substrate as described herein (e.g., as illustrated and described above with the assemblies of FIGS. 1A-1B, 2, 3A-3B and 4-5)—or any other components from the figures described herein.

Note that device package 610 may be a single component/device, a subset of components, and/or an entire system, as the materials, features, and components may be limited to device package 610 and/or any other component of the computing device 600 that may need the assembly with the stacked and swapped structures as described herein (e.g., the motherboard 602, the processor 604, and/or any other component of the computing device 600 that may need the embodiments of the assemblies described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip 606 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1: an assembly, comprising: a substrate having a first interconnect and a second interconnect, wherein the first interconnect has a first conductive pad and a second conductive pad, and wherein the second interconnect has a third conductive pad and a fourth conductive pad; and a socket over the substrate, wherein the socket has a first pin, a second pin, and a base layer, wherein the base layer includes a first pad and a second pad, wherein the first pin is vertically over the first interconnect, wherein the second pin is vertically over the second interconnect, wherein the first pad is directly coupled to the first pin and the fourth conductive pad of the second interconnect, and wherein the second pad is directly coupled to the second pin and the second conductive pad of the first interconnect.

Example 2: the assembly of Example 1, wherein the first pad of the socket is at least partially within a footprint of the third conductive pad of the second interconnect of the substrate, and wherein the second pad of the socket is at least partially within a footprint of the first conductive pad of the first interconnect of the substrate.

Example 3: the assembly of Examples 1-2, wherein the first pin is on the first pad, wherein the second pin is on the second pad, wherein the first pin of the socket is conductively coupled to the first interconnect of the substrate, and wherein the second pin of the socket is conductively coupled to the second interconnect of the substrate.

Example 4: the assembly of Examples 1-3, wherein the substrate is comprised of a high-density interconnect substrate, a low-density interconnect substrate, or an interposer.

Example 5: the assembly of Example 1-4, wherein the first interconnect has a first via, a second via, a first conductive line, and a second conductive line, and wherein the second interconnect has a third via, a fourth via, a third conductive line, and a fourth conductive line.

Example 6: the assembly of Example 1-5, wherein the first via conductively couples the first conductive pad to the first conductive line, wherein the second via conductively couples the first conductive line to the second conductive line, and wherein the second conductive line conductively couples the second via to the second conductive pad.

Example 7: the assembly of Examples 1-6, wherein the third via conductively couples the third conductive pad to the third conductive line, wherein the fourth via conductively couples the third conductive line to the fourth conductive line, and wherein the fourth conductive line conductively couples the fourth via to the fourth conductive pad.

Example 8: the assembly of Examples 1-7, wherein the first via of the first interconnect has a thickness that is substantially equal to a thickness of the third via of the second interconnect.

Example 9: the assembly of Examples 1-8, wherein the second via of the first interconnect has a thickness that is substantially equal to a thickness of the fourth via of the second interconnect.

Example 10: a substrate, comprising: a body having a top surface and a bottom surface that is opposite from the top surface, wherein the top surface has a first conductive layer and a first dielectric layer, and wherein the bottom surface has a second conductive layer and a second dielectric layer; a plurality of interconnects in the body, wherein the plurality of interconnects have a plurality of first conductive pads on the top surface of the body, and a plurality of second conductive pads on the bottom surface of the body, wherein the plurality of interconnects vertically extend from the plurality of first conductive pads to the plurality of second conductive pads, and wherein the plurality of interconnects conductively couple the plurality of first conductive pads to the plurality of second conductive pads; and a first interconnect and a second interconnect in the body, wherein the first interconnect has a first conductive pad on the bottom surface of the body, and a second conductive pad on the top surface of the body, wherein the second interconnect has a third conductive pad on the bottom surface of the body, and a fourth conductive pad on the top surface of the body, wherein the first interconnect is directly adjacent to the second interconnect, wherein the first and second interconnects are in between the plurality of interconnects, wherein the first and second interconnects are part of a swapped structure in the body, wherein the second conductive pad of the first interconnect is at least partially within a footprint of the third conductive pad of the second interconnect, and wherein the fourth conductive pad of the second interconnect is at least partially within a footprint of the first conductive pad of the first interconnect.

Example 11: the substrate of Example 10, further comprising a third conductive layer in the body, wherein the third conductive layer is between the first and second conductive layers, wherein the third conductive layer is proximately below the first conductive layer, wherein the first interconnect has a first via, a second via, a first conductive line, and a second conductive line, wherein the second interconnect has a third via, a fourth via, a third conductive line, and a fourth conductive line, wherein the swapped structure is directly between the first conductive layer and the third conductive layer, and wherein the swapped structure is comprised of the second via, the first and second conductive lines, and the second conductive pad of the first interconnect, and comprised of the fourth via, the third and fourth conductive lines, and the fourth conductive pad of the second interconnect.

Example 12: the substrate of Examples 10-11, wherein the first conductive pad is below the second dielectric layer, wherein the first via vertically extends from the first conductive pad to the third conductive layer, wherein the first via conductively couples the first conductive pad to the first conductive line in the third conductive layer, wherein the second via vertically extends from the third conductive layer to the first conductive layer, wherein the second via conductively couples the first conductive line to the second conductive line in the first conductive layer, wherein the second conductive line conductively couples the second via to the second conductive pad, wherein the second conductive pad is on the second conductive line and the first dielectric layer, and wherein the first dielectric layer is over the second conductive line of the first conductive layer.

Example 13: the substrate of Examples 10-12, wherein the third conductive pad is below the second dielectric layer, wherein the third via vertically extends from the third conductive pad to the third conductive layer, wherein the third via conductively couples the third conductive pad to the third conductive line in the third conductive layer, wherein the fourth via vertically extends from the third conductive layer to the first conductive layer, wherein the fourth via conductively couples the third conductive line to the fourth conductive line in the first conductive layer, wherein the fourth conductive line conductively couples the fourth via to the fourth conductive pad, wherein the fourth conductive pad is on the fourth conductive line and the second dielectric layer, and wherein the first dielectric layer is over the second conductive line of the first conductive layer.

Example 14: the substrate of Example 10-13, further comprising a socket over the top surface of the body, wherein the socket has a first pin, a second pin, and a base layer, wherein the base layer includes a first pad and a second pad, wherein the base layer is directly above and parallel to the first conductive layer, wherein the first pin is vertically over the first interconnect, wherein the second pin is vertically over the second interconnect, wherein the first pad is directly coupled to the first pin and the fourth conductive pad of the second interconnect, and wherein the second pad is directly coupled to the second pin and the second conductive pad of the first interconnect.

Example 15: the substrate of Examples 10-14, wherein the first pin is on the first pad, wherein the second pin is on the second pad, wherein the first pin of the socket is conductively coupled to the first interconnect, and wherein the second pin of the socket is conductively coupled to the second interconnect.

Example 16: the substrate of Examples 10-15, wherein the first pad of the socket is at least partially within the footprint of the third conductive pad of the second interconnect, and wherein the second pad of the socket is at least partially within the footprint of the first conductive pad of the first interconnect.

Example 17: the substrate of Examples 10-16, wherein the first via of the first interconnect has a thickness that is substantially equal to a thickness of the third via of the second interconnect.

Example 18: the substrate of Examples 10-17, wherein the second via of the first interconnect has a thickness that is substantially equal to a thickness of the fourth via of the second interconnect.

Example 19: an electronic packaged assembly, comprising: a substrate on a first package substrate, wherein the substrate has a first interconnect and a second interconnect, wherein the first interconnect has a first conductive pad and a second conductive pad, and wherein the second interconnect has a third conductive pad and a fourth conductive pad; a socket over the substrate, wherein the substrate conductively couples the socket to the first package substrate, wherein the socket has a first pin, a second pin, and a base layer, wherein the base layer includes a first pad and a second pad, wherein the first pin is vertically over the first interconnect, wherein the second pin is vertically over the second interconnect, wherein the first pad is directly coupled to the first pin and the fourth conductive pad of the second interconnect, and wherein the second pad is directly coupled to the second pin and the second conductive pad of the first interconnect; a second package substrate over the socket, wherein the socket conductively couples the second package substrate to the substrate; and a die over the second package substrate.

Example 20: the electronic packaged assembly of Example 19, wherein the first pad of the socket is at least partially within a footprint of the third conductive pad of the second interconnect of the substrate, wherein the second pad of the socket is at least partially within a footprint of the first conductive pad of the first interconnect of the substrate, wherein the first pin is on the first pad, wherein the second pin is on the second pad, wherein the first pin of the socket is conductively coupled to the first interconnect of the substrate, and wherein the second pin of the socket is conductively coupled to the second interconnect of the substrate.

Example 21: the electronic packaged assembly of Examples 19-20, wherein the substrate is comprised of a high-density interconnect substrate, a low-density interconnect substrate, or an interposer, wherein the first package substrate is a board, and wherein the second package substrate is an electronic package substrate.

Example 22: the electronic packaged assembly of Examples 19-21, wherein the first interconnect has a first via, a second via, a first conductive line, and a second conductive line, and wherein the second interconnect has a third via, a fourth via, a third conductive line, and a fourth conductive line.

Example 23: the electronic packaged assembly of Examples 19-22, wherein the first via conductively couples the first conductive pad to the first conductive line, wherein the second via conductively couples the first conductive line to the second conductive line, and wherein the second conductive line conductively couples the second via to the second conductive pad.

Example 24: the electronic packaged assembly of Examples 19-23, wherein the third via conductively couples the third conductive pad to the third conductive line, wherein the fourth via conductively couples the third conductive line to the fourth conductive line, and wherein the fourth conductive line conductively couples the fourth via to the fourth conductive pad.

Example 25: the electronic packaged assembly of Examples 19-24, wherein the first via of the first interconnect has a thickness that is substantially equal to a thickness of the third via of the second interconnect, and wherein the second via of the first interconnect has a thickness that is substantially equal to a thickness of the fourth via of the second interconnect.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An assembly, comprising:
a substrate having a first interconnect and a second interconnect, wherein the first interconnect has a first conductive pad and a second conductive pad, and wherein the second interconnect has a third conductive pad and a fourth conductive pad; and
a socket over the substrate, wherein the socket has a first pin, a second pin, and a base layer, wherein the base layer includes a first pad and a second pad, wherein the first pin is vertically over the first interconnect, wherein the second pin is vertically over the second interconnect, wherein the first pad is directly coupled to the first pin and the fourth conductive pad of the second interconnect, and wherein the second pad is directly coupled to the second pin and the second conductive pad of the first interconnect.

2. The assembly of claim 1, wherein the first pad of the socket is at least partially within a footprint of the third conductive pad of the second interconnect of the substrate, and wherein the second pad of the socket is at least partially within a footprint of the first conductive pad of the first interconnect of the substrate.

3. The assembly of claim 1, wherein the first pin is on the first pad, wherein the second pin is on the second pad, wherein the first pin of the socket is conductively coupled to the first interconnect of the substrate, and wherein the second pin of the socket is conductively coupled to the second interconnect of the substrate.

4. The assembly of claim 1, wherein the substrate is comprised of a high-density interconnect substrate, a low-density interconnect substrate, or an interposer.

5. The assembly of claim 1, wherein the first interconnect has a first via, a second via, a first conductive line, and a second conductive line, and wherein the second interconnect has a third via, a fourth via, a third conductive line, and a fourth conductive line.

6. The assembly of claim 5, wherein the first via conductively couples the first conductive pad to the first conductive line, wherein the second via conductively couples the first conductive line to the second conductive line, and wherein the second conductive line conductively couples the second via to the second conductive pad.

7. The assembly of claim 6, wherein the third via conductively couples the third conductive pad to the third conductive line, wherein the fourth via conductively couples the third conductive line to the fourth conductive line, and wherein the fourth conductive line conductively couples the fourth via to the fourth conductive pad.

8. The assembly of claim 7, wherein the first via of the first interconnect has a thickness that is substantially equal to a thickness of the third via of the second interconnect.

9. The assembly of claim 7, wherein the second via of the first interconnect has a thickness that is substantially equal to a thickness of the fourth via of the second interconnect.

10. A substrate, comprising:
a body having a top surface and a bottom surface that is opposite from the top surface, wherein the top surface has a first conductive layer and a first dielectric layer, and wherein the bottom surface has a second conductive layer and a second dielectric layer;
a plurality of interconnects in the body, wherein the plurality of interconnects have a plurality of first conductive pads on the top surface of the body, and a plurality of second conductive pads on the bottom surface of the body, wherein the plurality of interconnects vertically extend from the plurality of first conductive pads to the plurality of second conductive pads, and wherein the plurality of interconnects conductively couple the plurality of first conductive pads to the plurality of second conductive pads; and
a first interconnect and a second interconnect in the body, wherein the first interconnect has a first conductive pad on the bottom surface of the body, and a second conductive pad on the top surface of the body, wherein the second interconnect has a third conductive pad on the bottom surface of the body, and a fourth conductive pad on the top surface of the body, wherein the first interconnect is directly adjacent to the second interconnect, wherein the first and second interconnects are in between the plurality of interconnects, wherein the first and second interconnects are part of a swapped structure in the body, wherein the second conductive pad of the first interconnect is at least partially within a footprint of the third conductive pad of the second interconnect, and wherein the fourth conductive pad of the second interconnect is at least partially within a footprint of the first conductive pad of the first interconnect.

11. The substrate of claim 10, further comprising a third conductive layer in the body, wherein the third conductive layer is between the first and second conductive layers, wherein the third conductive layer is proximately below the first conductive layer, wherein the first interconnect has a first via, a second via, a first conductive line, and a second conductive line, wherein the second interconnect has a third via, a fourth via, a third conductive line, and a fourth conductive line, wherein the swapped structure is directly between the first conductive layer and the third conductive layer, and wherein the swapped structure is comprised of the second via, the first and second conductive lines, and the second conductive pad of the first interconnect, and comprised of the fourth via, the third and fourth conductive lines, and the fourth conductive pad of the second interconnect.

12. The substrate of claim 11, wherein the first conductive pad is below the second dielectric layer, wherein the first via vertically extends from the first conductive pad to the third conductive layer, wherein the first via conductively couples the first conductive pad to the first conductive line in the third conductive layer, wherein the second via vertically extends from the third conductive layer to the first conductive layer, wherein the second via conductively couples the first conductive line to the second conductive line in the first conductive layer, wherein the second conductive line conductively couples the second via to the second conductive pad, wherein the second conductive pad is on the second conductive line and the first dielectric layer, and wherein the first dielectric layer is over the second conductive line of the first conductive layer.

13. The substrate of claim 11, wherein the third conductive pad is below the second dielectric layer, wherein the third via vertically extends from the third conductive pad to the third conductive layer, wherein the third via conductively couples the third conductive pad to the third conductive line in the third conductive layer, wherein the fourth via vertically extends from the third conductive layer to the first conductive layer, wherein the fourth via conductively couples the third conductive line to the fourth conductive line in the first conductive layer, wherein the fourth conductive line conductively couples the fourth via to the fourth conductive pad, wherein the fourth conductive pad is on the fourth conductive line and the second dielectric layer, and wherein the first dielectric layer is over the second conductive line of the first conductive layer.

14. The substrate of claim 10, further comprising a socket over the top surface of the body, wherein the socket has a first pin, a second pin, and a base layer, wherein the base layer includes a first pad and a second pad, wherein the base layer is directly above and parallel to the first conductive layer, wherein the first pin is vertically over the first interconnect, wherein the second pin is vertically over the second interconnect, wherein the first pad is directly coupled to the first pin and the fourth conductive pad of the second interconnect, and wherein the second pad is directly coupled to the second pin and the second conductive pad of the first interconnect.

15. The substrate of claim 14, wherein the first pin is on the first pad, wherein the second pin is on the second pad, wherein the first pin of the socket is conductively coupled to the first interconnect, and wherein the second pin of the socket is conductively coupled to the second interconnect.

16. The substrate of claim 15, wherein the first pad of the socket is at least partially within the footprint of the third conductive pad of the second interconnect, and wherein the second pad of the socket is at least partially within the footprint of the first conductive pad of the first interconnect.

17. The substrate of claim 10, wherein the first via of the first interconnect has a thickness that is substantially equal to a thickness of the third via of the second interconnect.

18. The substrate of claim 10, wherein the second via of the first interconnect has a thickness that is substantially equal to a thickness of the fourth via of the second interconnect.

19. An electronic packaged assembly, comprising:
a substrate on a first package substrate, wherein the substrate has a first interconnect and a second interconnect, wherein the first interconnect has a first conductive pad and a second conductive pad, and wherein the second interconnect has a third conductive pad and a fourth conductive pad;
a socket over the substrate, wherein the substrate conductively couples the socket to the first package substrate, wherein the socket has a first pin, a second pin, and a base layer, wherein the base layer includes a first pad and a second pad, wherein the first pin is vertically over the first interconnect, wherein the second pin is vertically over the second interconnect, wherein the first pad is directly coupled to the first pin and the fourth conductive pad of the second interconnect, and wherein the second pad is directly coupled to the second pin and the second conductive pad of the first interconnect;
a second package substrate over the socket, wherein the socket conductively couples the second package substrate to the substrate; and
a die over the second package substrate.

20. The electronic packaged assembly of claim 19, wherein the first pad of the socket is at least partially within a footprint of the third conductive pad of the second interconnect of the substrate, wherein the second pad of the socket is at least partially within a footprint of the first conductive pad of the first interconnect of the substrate, wherein the first pin is on the first pad, wherein the second pin is on the second pad, wherein the first pin of the socket is conductively coupled to the first interconnect of the substrate, and wherein the second pin of the socket is conductively coupled to the second interconnect of the substrate.

21. The electronic packaged assembly of claim 19, wherein the substrate is comprised of a high-density interconnect substrate, a low-density interconnect substrate, or an interposer, wherein the first package substrate is a board, and wherein the second package substrate is an electronic package substrate.

22. The electronic packaged assembly of claim 19, wherein the first interconnect has a first via, a second via, a first conductive line, and a second conductive line, and wherein the second interconnect has a third via, a fourth via, a third conductive line, and a fourth conductive line.

23. The electronic packaged assembly of claim 22, wherein the first via conductively couples the first conductive pad to the first conductive line, wherein the second via conductively couples the first conductive line to the second conductive line, and wherein the second conductive line conductively couples the second via to the second conductive pad.

24. The electronic packaged assembly of claim 23, wherein the third via conductively couples the third conductive pad to the third conductive line, wherein the fourth via conductively couples the third conductive line to the fourth conductive line, and wherein the fourth conductive line conductively couples the fourth via to the fourth conductive pad.

25. The electronic packaged assembly of claim 24, wherein the first via of the first interconnect has a thickness that is substantially equal to a thickness of the third via of the second interconnect, and wherein the second via of the first interconnect has a thickness that is substantially equal to a thickness of the fourth via of the second interconnect.

* * * * *